(12) United States Patent
Fratin et al.

(10) Patent No.: US 12,068,192 B2
(45) Date of Patent: *Aug. 20, 2024

(54) ARCHITECTURE OF THREE-DIMENSIONAL MEMORY DEVICE AND METHODS REGARDING THE SAME

(71) Applicant: Micron Technology, Inc., Boise, ID (US)

(72) Inventors: Lorenzo Fratin, Buccinasco (IT); Enrico Varesi, Milan (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 194 days.

This patent is subject to a terminal disclaimer.

(21) Appl. No.: 17/573,217

(22) Filed: Jan. 11, 2022

(65) Prior Publication Data

US 2022/0208602 A1    Jun. 30, 2022

Related U.S. Application Data

(62) Division of application No. 16/402,357, filed on May 3, 2019, now Pat. No. 11,244,855.

(51) Int. Cl.
*H01L 23/00* (2006.01)
*G11C 5/02* (2006.01)
(Continued)

(52) U.S. Cl.
CPC ........ *H01L 21/76816* (2013.01); *G11C 5/025* (2013.01); *G11C 5/063* (2013.01);
(Continued)

(58) Field of Classification Search
CPC ....... G11C 5/063; G11C 8/08; G11C 13/0004; G11C 5/025; G11C 2213/71; G11C 8/14;
(Continued)

(56) References Cited

U.S. PATENT DOCUMENTS 7,646,630 B2   1/2010   Lowrey et al.
8,729,523 B2   5/2014   Pio
(Continued)

FOREIGN PATENT DOCUMENTS

JP   2017-224830 A   12/2017
KR   10-2016-0113188 A   9/2016
(Continued)

OTHER PUBLICATIONS

Intellectual Property Office, "Office Action," issued in connection with ROC (Taiwan) Patent Application No. 109112605, dated Dec. 8, 2020 (7 pages).
(Continued)

*Primary Examiner* — Hrayr A Sayadian
(74) *Attorney, Agent, or Firm* — Holland & Hart LLP

(57) ABSTRACT

Architectures of 3D memory arrays, systems, and methods regarding the same are described. An array may include a substrate arranged with conductive contacts in a geometric pattern and openings through alternative layers of conductive and insulative material that may decrease the spacing between the openings while maintaining a dielectric thickness to sustain the voltage to be applied to the array. After etching material, a sacrificial layer may be deposited in a trench that forms a serpentine shape. Portions of the sacrificial layer may be removed to form openings, into which cell material is deposited. An insulative material may be formed in contact with the sacrificial layer. The conductive pillars extend substantially perpendicular to the planes of the conductive material and the substrate, and couple to conductive contacts. A chalcogenide material may be formed in the recesses partially around the conductive pillars.

14 Claims, 13 Drawing Sheets

(51) Int. Cl.
*G11C 5/06* (2006.01)
*G11C 8/08* (2006.01)
*H01L 21/02* (2006.01)
*H01L 21/768* (2006.01)

(52) U.S. Cl.
CPC .......... *G11C 8/08* (2013.01); *H01L 21/02568* (2013.01); *H01L 21/76843* (2013.01); *H01L 24/17* (2013.01)

(58) Field of Classification Search
CPC ......... H01L 21/76843; H01L 21/02568; H01L 21/76816; H01L 24/17
USPC .................................................. 257/288, 438
See application file for complete search history.

(56) References Cited

U.S. PATENT DOCUMENTS

| | | | |
|---|---|---|---|
| 8,778,762 | B2 | 7/2014 | Keshav et al. |
| 8,841,649 | B2 | 9/2014 | Pio |
| 9,911,790 | B1 | 3/2018 | Shimabukuro et al. |
| 11,158,673 | B2 * | 10/2021 | Fantini .................... H10B 63/84 |
| 2007/0285963 | A1 * | 12/2007 | Toda ....................... H10B 63/20 365/148 |
| 2008/0165569 | A1 | 7/2008 | Chen et al. |
| 2009/0321878 | A1 | 12/2009 | Koo et al. |
| 2011/0140068 | A1 | 6/2011 | Ozawa et al. |
| 2011/0186851 | A1 | 8/2011 | Son et al. |
| 2011/0316063 | A1 | 12/2011 | Tang et al. |
| 2012/0147644 | A1 | 6/2012 | Scheuerlein |
| 2012/0261638 | A1 * | 10/2012 | Sills ..................... H10N 70/823 257/E45.001 |
| 2014/0217349 | A1 | 8/2014 | Hopkins |
| 2014/0295638 | A1 | 10/2014 | Pio |
| 2015/0213891 | A1 * | 7/2015 | Fantini ............... G11C 13/0033 365/163 |
| 2016/0056210 | A1 | 2/2016 | Takaki |
| 2016/0064078 | A1 * | 3/2016 | Fantini .................... G11C 11/56 365/163 |
| 2016/0126292 | A1 | 5/2016 | Yanagida et al. |
| 2016/0141337 | A1 | 5/2016 | Shimabukuro et al. |
| 2017/0352704 | A1 | 12/2017 | Simsek-Ege et al. |
| 2018/0219153 | A1 | 8/2018 | Hopkins |
| 2018/0294312 | A1 | 10/2018 | Pellizzer et al. |
| 2019/0067371 | A1 | 2/2019 | Pirovano et al. |
| 2019/0115071 | A1 | 4/2019 | Nardi et al. |
| 2019/0115391 | A1 * | 4/2019 | Nardi .................. G11C 13/004 |

FOREIGN PATENT DOCUMENTS

| | | |
|---|---|---|
| TW | 201426750 A | 7/2014 |
| TW | 201426979 A | 7/2014 |

OTHER PUBLICATIONS

International Search Report and Written Opinion received for PCT Patent Application No. PCT/US20/26647, mailed on Jul. 29, 2020, 10 pages.

Japan Patent Office, "Office Action," issued in connection with Japan Patent Application No. 2021-564690 dated Feb. 21, 2023 (15 pages) (8 pages of English Translation and 7 pages of Original Document).

European Patent Office, "Supplementary European search report," issued in connection with European Patent Application No. 20803009 dated Nov. 22, 2022 (8 pages).

* cited by examiner

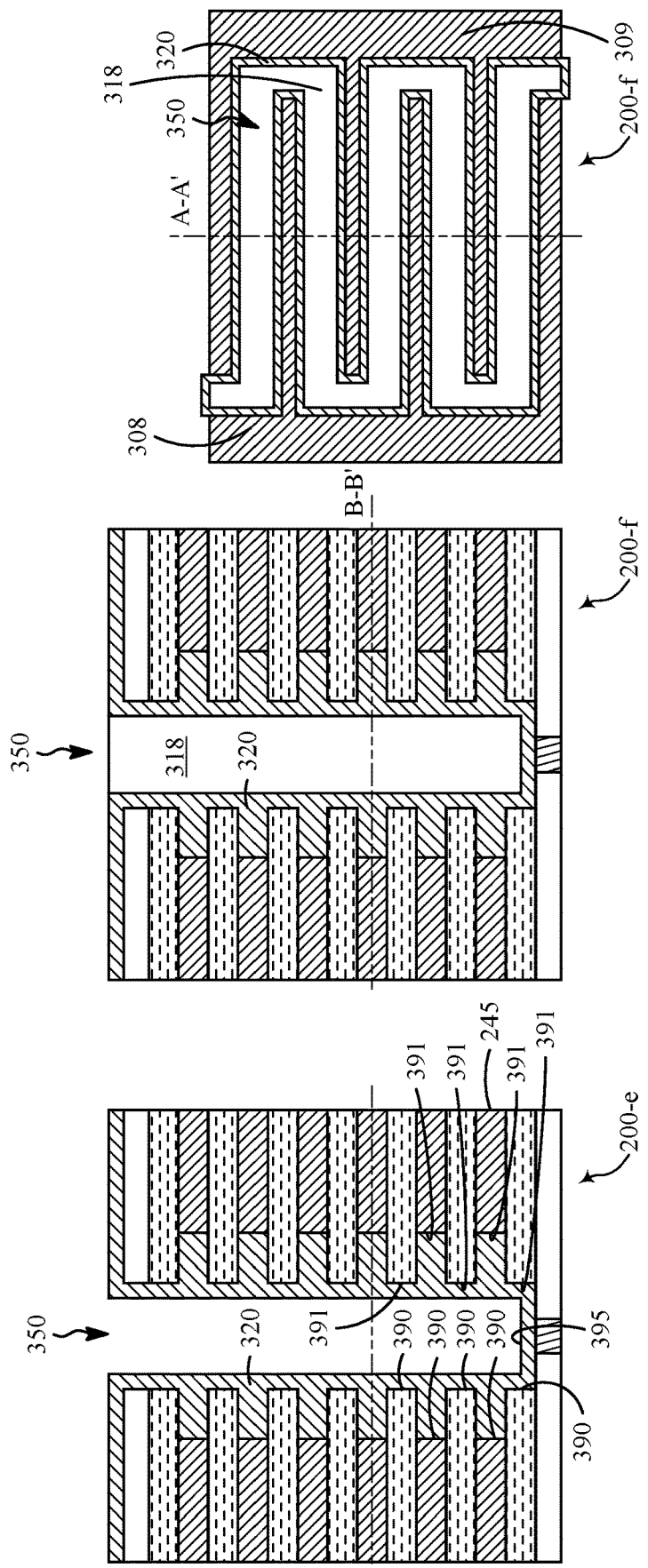

ARCHITECTURE OF THREE-DIMENSIONAL MEMORY DEVICE AND METHODS REGARDING THE SAME

CROSS REFERENCE

The present Application for Patent is a divisional of U.S. patent application Ser. No. 16/402,357 by Fratin et al., entitled "ARCHITECTURE OF THREE-DIMENSIONAL MEMORY DEVICE AND METHODS REGARDING THE SAME," filed May 3, 2019, assigned to the assignee hereof, and is expressly incorporated by reference in its entirety herein.

BACKGROUND

The following relates generally to a system that includes at least one memory device and more specifically to the architecture of three-dimensional memory devices and methods regarding the same.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

BRIEF DESCRIPTION OF THE DRAWINGS

FIGS. 3A through 3E illustrate various views of example 3D memory arrays in accordance with examples as disclosed herein.

DETAILED DESCRIPTION

Figure 1:
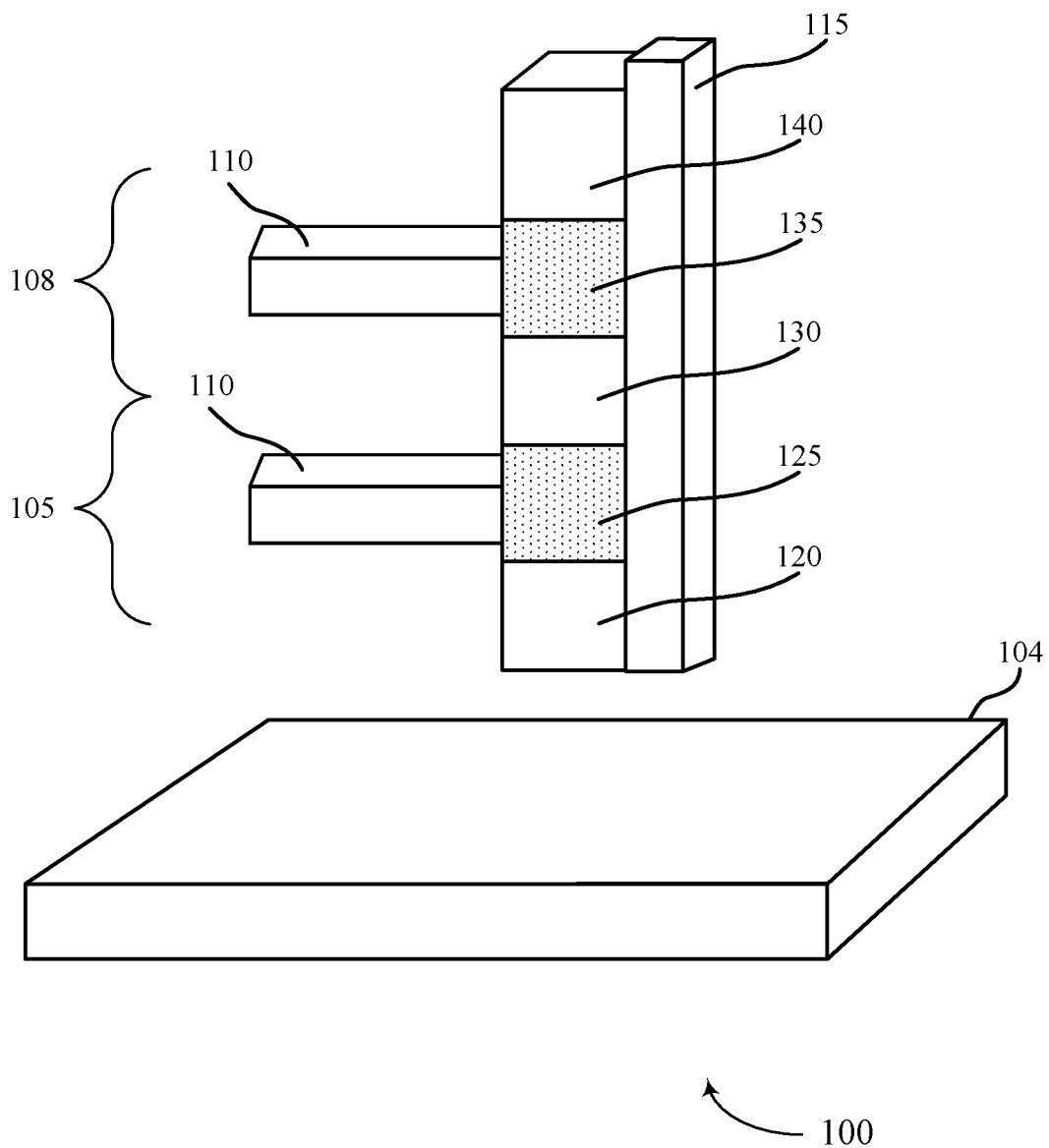
FIG. 1 illustrates an example of a three-dimensional (3D) memory array that supports architecture of three-dimensional memory device and methods regarding the same in accordance with examples as disclosed herein.

The present disclosure relates to three-dimensional (3D) vertical self-selecting memory arrays with an increased density of memory cells, and methods of processing the same. The memory arrays may include an arrangement of conductive contacts and openings through alternative layers of conductive materials and insulative material that may decrease the spacing between the memory cells while maintaining a dielectric thickness to sustain the voltage to be applied to the memory array.

In some examples, a 3D memory array may include a substrate with a plurality of contacts arranged in a pattern (e.g., a geometric pattern) and a first insulative material (e.g., a dielectric material) formed on the substrate. A plurality of planes of a conductive material may be separated by one another by a second insulative material (e.g., a dielectric material) and formed on the substrate material. The planes of conductive material may be examples of word lines.

During manufacturing of such a memory array, a trench may be formed in a shape that separates odd and even WL line planes to create "comb" structures (e.g., structures that look like a tool with fingers and space between the fingers). The trench may any geometric configuration and include odd and even groups of fingers of the comb facing one another at a fixed distance. In some examples, the trench may be formed in a serpentine shape. The trench may divide each plane of conductive material into two sections or two plates. Each place of conductive material may be an example of a word line plate. In some examples, inside the trench, the planes of the conductive material may be etched in such a way that the dielectric materials and the conductive materials form a plurality of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer. The sacrificial layer and the insulative layer may form a serpentine shape. In some examples, other geometric configurations of the trench are contemplated.

Portions of the sacrificial layer and the insulative may be removed to form openings. The openings may expose portions of the substrate, the plurality of conductive contacts, and portions of the conductive materials and dielectric materials. A storage element material (e.g., the chalcogenide material) may be deposited in the openings. The storage element material may fill the recesses formed by the dielectric materials and the conductive materials. The storage element material may be partially removed from the openings such that only the storage element materials in the recesses remain.

Conductive pillars may be formed in the openings that include the storage element materials in the recesses. The conductive pillars may be examples of a digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material.

Such configurations of a memory array and the methods of manufacturing may allow a higher-density of memory cells relative to previous solutions. Each memory cell (e.g., storage element material) may be recessed inside opposite sides of the conductive pillar to ensure the cell isolation. Such a configuration may allow for a tighter control of cell thickness and dimension with respect to some previous solutions. Each plane of conductive material that intersects the conductive pillar may form two memory cells addressed by a first word line plate in the plane and a second word line plate in the plane. Each conductive pillar may be decoded by a transistor positioned at the bottom or top of the memory array. The transistor may be an example of a digit line selector formed in a regular matrix.

Features of the disclosure are initially described in the context of a memory array as described with reference to FIG. 1. Features of the disclosure are described in the context of different views of example 3D memory arrays during processing steps as described with reference to FIGS. 2-7. These and other features of the disclosure are further illustrated by and described with reference to flowcharts that relate to 3D vertical memory array architecture as described with references to FIGS. 8-11.

FIG. 1 illustrates an example of a 3D memory array 100 in accordance with aspects of the present disclosure. Memory array 100 may include a first array or deck 105 of memory cells that is positioned above a substrate 104 and a second array or deck 108 of memory cells on top of the first array or deck 105.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a plurality of contacts arranged in a grid or staggered pattern. In some cases, the plurality of contacts may extend through the substrate and couple with an access line of the memory array 100. The memory array 100 may include a plurality of planes of a conductive material separated by one another by a second insulative material formed on the first insulative material on the substrate material. Each of the plurality of planes of the conductive material may include a plurality of recesses formed therein. The plurality of planes, for example, word line plates, may be obtained by a replacement process by using a sacrificial layer (e.g., a conformal layer) for etching during a stack deposition processing step, removing the conformal layer after cell definition and replacing the conformal layer with a more conductive material.

An insulative material may be formed in a serpentine shape through the second insulative material and the conductive material. A plurality of conductive pillars may be arranged in openings to extend substantially perpendicular to the plurality of planes of the conductive material and the substrate. Each respective one of the plurality of conductive pillars may be coupled to a different one of the conductive contacts.

In some examples, the memory decks 105 and 108 may include chalcogenide material configured to store logic states. For example, the memory cells of the memory decks 105 and 108 may be examples of self-selecting memory cells. A chalcogenide material may be formed in the plurality of recesses such that the chalcogenide material in each respective one of the plurality of recesses is at least partially in contact with one of the plurality of conductive pillars.

Figure 2B:
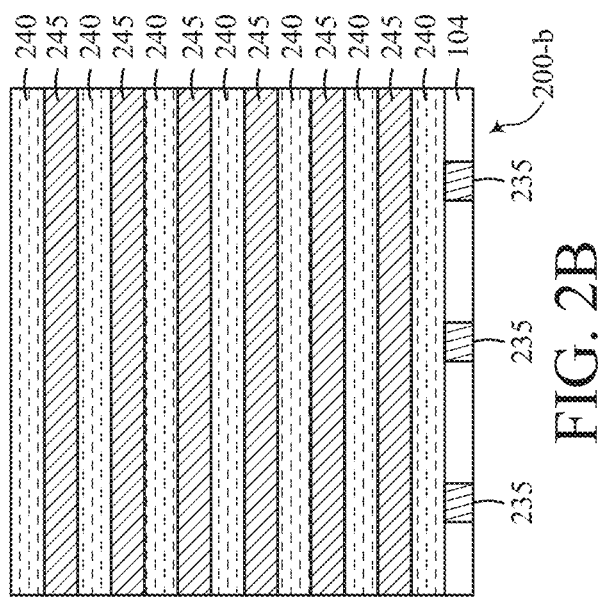
FIG. 2B illustrates a side view of an example 3D memory array in accordance with examples as disclosed herein.
Figure 2A:
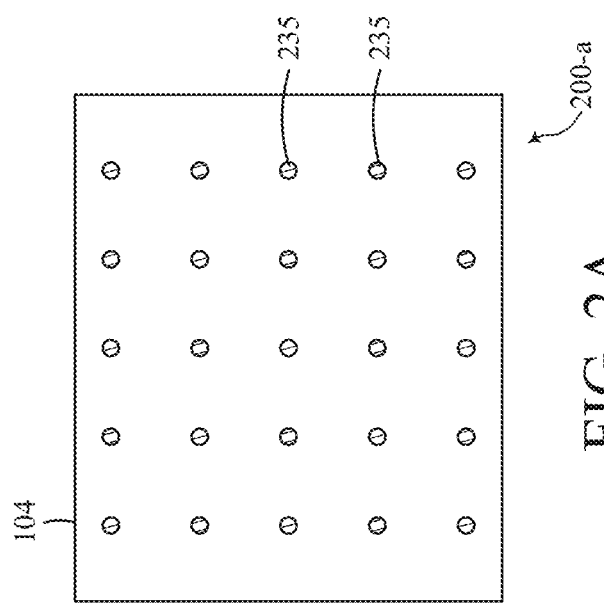
FIG. 2A illustrates a bottom view of an example 3D memory array in accordance with examples as disclosed herein.

FIG. 2A illustrates a bottom view of an example 3D memory array 200-*a* in accordance with examples as disclosed herein. The memory array 200-*a* may include a plurality of conductive contacts 235 formed in a substrate 104 and extend through the substrate 104 and couple with an access line of the memory array 100. For example, the substrate 104 may be a dielectric material, such as a dielectric film.

A single conductive contact of the plurality of conductive contacts 235 may be configured to couple any single vertical pillar with a transistor (not shown). The plurality of conductive contacts 235 may be arranged in a grid pattern. In some examples, a respective one of the plurality of conductive contacts 235 may be surrounded by up to eight other conductive contacts 235. In some examples, the plurality of conductive contacts 235 may be arranged in a staggered pattern or a hexagonal pattern. For example, a respective one of the plurality of conductive contacts 235 may be surrounded by up to six other conductive contacts 235 (see FIGS. 6A and 6B).

FIG. 2B illustrates a side view of an example 3D memory array 200-b in accordance with examples as disclosed herein. The memory array 200-b may include plurality of conductive contacts 235 may be formed in the substrate 104. The memory array 200-b may also include a plurality of stacked planes of an insulative material 240 and a plurality of stacked planes of a conductive material 245 (e.g., word lines planes or word line plates). The stacked planes of conductive material 245 may be separated in a z-direction (e.g., separated vertically) from one another by the plurality of planes of the insulative material 240. For example, a first plane (e.g., a bottom plane) of the second insulative material 240 may be formed (e.g., deposited) on the plane of the substrate 104, and then a plane of the conductive material 245 may be formed on the first plane of the second insulative material 240. In some examples, a layer of the first insulative material 240 may be deposited on the substrate 104. In some examples, the conductive material 245 may be a layer of conductive carbon or other conductive layer compatible with active materials. In some examples, the conductive material 245 may include conductive layers separated by active material through a protective barrier. The conductive material 245 may be configured to function as at least one word line plate. In some examples, the conductive material 245 and the insulative material 240 form a plurality of layers, such as alternating layers.

Additional planes of the second insulative material 240 may be formed on the conductive material 245 in an alternating manner as illustrated in FIG. 2B. The second insulative material 240 may be a dielectric material, such as a dielectric film or layer. In some examples, the second insulative material 240 and the substrate 104 may be the same type of insulative material. Examples of the insulative materials disclosed herein include, but are not limited to dielectric materials, such as silicon oxide.

Each respective one of the plurality of planes of the conductive material 245 may be at (e.g., form) a different level of the 3D memory array 200-b. Individual planes of material that form memory cells may be referred to as a deck of the 3D memory array 200-b. The conductive material 245 may comprise (e.g., be formed of) a metallic (or semi-metallic) material or a semiconductor material such as a doped polysilicon material, among others. In some examples, the conductive material 245 may be a plane of conductive carbon.

Six planes of the conductive material 245 and seven planes of the second insulative material 240 are shown in FIG. 2B. The seventh plane of the second insulative material 240 may be a topmost layer of the 3D memory array 200-b. The quantity of planes of the conductive material 245 and the second insulative material 240 are not limited to the quantities illustrated in FIG. 2B. The conductive material 245 and the second insulative material 240 may be arranged into more than six decks or less than six decks.

FIGS. 3A-E illustrates various views of example 3D memory arrays 200-c, 200-d, 200-e, and 200-f during a series of steps or processes that may be performed to form a stacked memory device, in accordance with examples as disclosed herein. Specifically, in FIGS. 3A-E, a process of forming even and odd word line planes is shown.

Figure 3B:
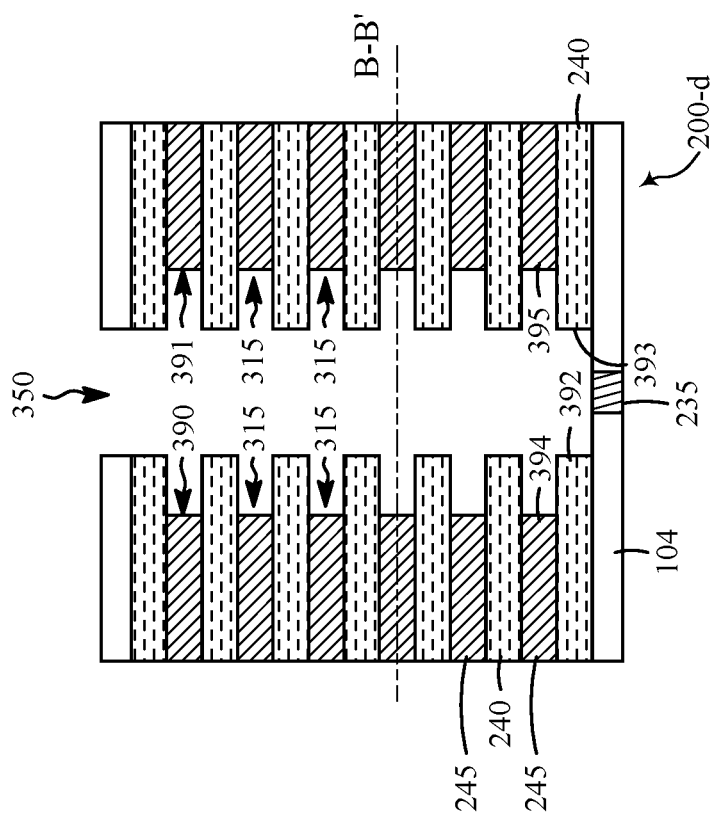
Figure 3A:
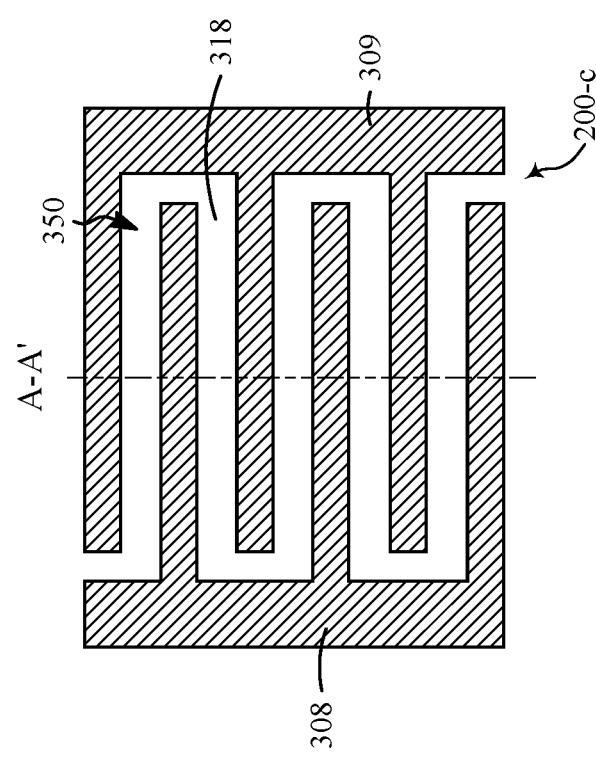

FIG. 3A illustrates a top view of an example 3D memory array 200-c, which may be an example of the memory array 200-b illustrated in FIG. 2B after a trench 350 is formed. FIG. 3B illustrates a cross-sectional view of an example 3D memory array 200-d along section line A-A' during a process step subsequent to what is illustrated in FIG. 3A. FIG. 3C illustrates a cross-sectional view of an example 3D memory array 200-e along section line A-A' during a process step subsequent to what is illustrated in FIG. 3B. FIG. 3D illustrates a cross-sectional view of an example 3D memory array 200-f along section line A-A' during a process step subsequent to what is illustrated in FIG. 3C. FIG. 3E illustrates a top view of an example 3D memory array 200-f of section line B-B' during a process step subsequent to what is illustrated in FIG. 3C. FIGS. 3A-E illustrate a series of steps or processes that may be performed to form a stacked memory device.

FIG. 3A illustrates forming the trench 350 through the alternating planes of conductive material 245 (shown in FIG. 3B) and the second insulative material 240 (shown in FIG. 3B) of memory array 200-c. The trench 350 may expose the substrate 104 (previously shown in FIGS. 2A and 2B) and the conductive contacts 235 (previously shown in FIGS. 2A and 2B) at the bottom of the trench 350.

The trench 350 may be etched from top to bottom and etched in a serpentine-shape. For instance, the trench 350 may pass over a row of the conductive contacts 235 in a first direction (e.g., from left to right) and then pass over an adjacent row of the conductive contacts 235 in a second direction that is opposite to the first direction (e.g., from right to left). With reference to the example of FIG. 3A, the trench 350 passes over a first row of the conductive contacts 235 from left to right, then "turns" and passes over the next (second) row of conductive contacts 235 (adjacent to the first row) from right to left. The trench 350 "turns" again and passes over the next (third) row of conductive contacts 235 (adjacent to the second row) from left to right. The trench 350 "turns" again and passes over the next (fourth) row of conductive contacts 235 (adjacent to the third row) from right to left and then "turns" again and passes over the next (fifth) row of conductive contacts 235 at the bottom of FIG. 3A (adjacent to the fourth row) from left to right.

The trench 350 may bifurcate each plane of the conductive material 245 into at least two portions: a first portion 308 and a second portion 309. Each portion of a plane of the conductive material 245 may be a different access line (e.g., even word line or odd word line) of a deck. For example, the first portion 308 may be a first access line of a deck of the 3D memory array 200-c and the second portion 309 may be a second access line of the same deck of the 3D memory array 200-c. The extension of the fingers forming the even or odd planes may be defined based on the resistivity of an electrode used and by the level of current delivery requested. Specifically, the depth of the recesses is defined depending on the thickness desired for the memory cell.

FIG. 3B illustrates forming a plurality of recesses 315 in the conductive material 245 in each of the planes of memory array 200-d. For example, a selective etching operation may be performed to form the plurality of recesses 315 in sidewalls 390 and 391 of the trench 350 in an isotropic way. In some examples, the trench 350 includes a first sidewall 390 spaced apart from a second sidewall 391, where a first portion 392 of the first sidewall 390 formed by the first insulative material 240 is spaced apart from a first portion 393 of the second sidewall 391 formed by the first insulative material 240 by a first distance. A second portion 394 of the first sidewall 390 formed by the first conductive material 245 may be spaced apart from a second portion 394 of the second sidewall 391 formed by the first conductive material 245 by a second distance greater than the first distance. In some examples, portions of sidewalls 390 and 391 of the trench 350 formed by the first conductive material 245 are recessed relative to portions of the sidewalls 390 and 391 of the trench 350 formed by the first insulative material 240.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 350 and a horizontal etching process may be used to form at least one recess 315 in at least one conductive material 245. The etching parameters may be selected such that the conductive material 245, for example, is etched faster than the second insulative material 240.

FIG. 3C illustrates forming a conformal material 320 (e.g., a sacrificial material or sacrificial layer). The conformal material 320 may be deposited into the trench 350 of memory array 200-e. The conformal material 320 may be formed in the recesses 315 (shown in FIG. 3B) by conformally depositing the conformal material 320. The conformal material 320 contacts a first sidewall 390, a second sidewall 391, and a bottom wall 395 of each trenches 350. Although FIG. 3C shows the conformal material 320 may be formed on the sidewalls of the trench 350 (e.g., on the surfaces of the second insulative material 240 and the conductive materials 245 in different layers facing into the trench 350) during formation of the conformal material 320 in the plurality of recesses 315, examples are not so limited. For example, the conformal material 320 may be confined to only the plurality of recesses 315 in the conductive materials 245 in different layers in some cases. In some cases, the conformal material 320 may be referred to as a conformal layer or a sacrificial layer.

In some cases, an etching operation may be performed subsequent to forming the conformal material 320. In the etching operation, the conformal material 320 may be etched to form an opening or trench 350. The etch operation may result in the surfaces of the conformal material 320 (e.g., the surfaces facing the trench 350) being spaced apart from the surfaces of the second insulative material 240 (e.g., the surfaces facing into the trench 350). In some cases, the etch operation may result in the surfaces of the conformal material 320 (e.g., the surfaces facing the trench 350) being approximately coplanar with surfaces of the second insulative material 240 (e.g., the surfaces facing into the trench 350), and thereby forming a continuous sidewall of trench. The etching operations described herein may be vertical etching processes (e.g., an anisotropic etching process or a dry etching process, or a combination thereof) or horizontal etching processes (e.g., an isotropic etching process). For example, a vertical etching process may be performed to vertically etch the trench 350 and a horizontal etching process may be used to form at least one recess in the first conductive material 245.

FIG. 3D illustrates depositing a dielectric material 318 in the trench 350 on top of the conformal material 320 of the memory array 200-f. The dielectric material 318 may contact the conformal material 320. The dielectric material 318 and the conformal material 320 may cooperate to fill the trench 350. In some cases, the dielectric material 318 may be an example of an insulative material. In some examples, the conformal material 320 may be etched back selectively to form a co-planar surface with the dielectric material 318. The depth of the recession may be defined depending on a desired thickness.

FIG. 3E illustrates a top view of an example 3D memory array 200-f after the dielectric material 318 is deposited (as shown in FIG. 3D), in accordance with an example of the present disclosure. In FIG. 3E, the conformal material 320 formed in the trench 350 and the dielectric material 318 bifurcates each plane of the conductive material 245 into a first portion 308 and a second portion 309.

FIGS. 4A-E illustrates various views of example 3D memory arrays 200-g, 200-h, 200-i, and 200-j, during a series of steps or processes that may be performed to form a stacked memory device, in accordance with examples as disclosed herein. Specifically, FIGS. 4A-E illustrate processes for forming memory cells in the memory array 200-f illustrated in FIGS. 3D and 3E.

Figure 4B:
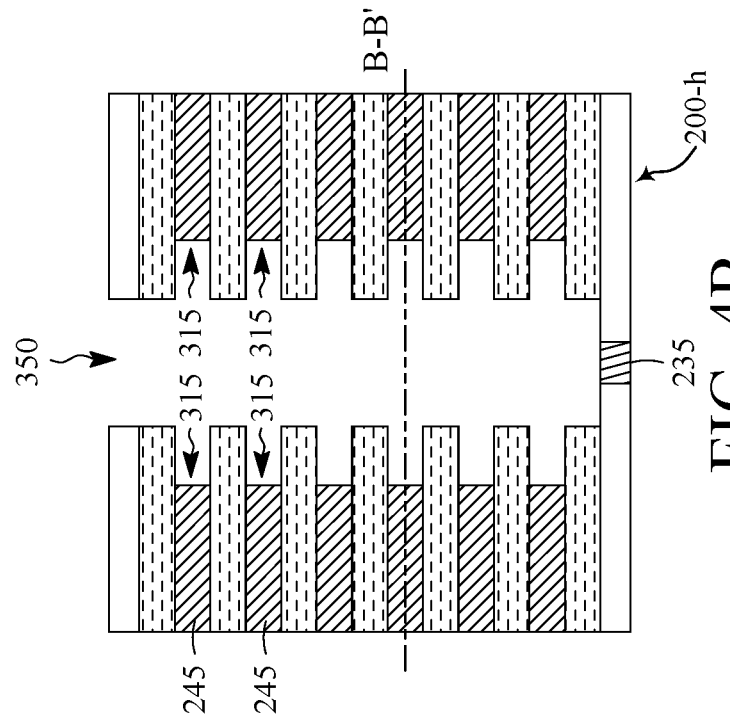
FIGS. 4A through 4E illustrate various views of example 3D memory arrays in accordance with examples as disclosed herein.
Figure 4A:
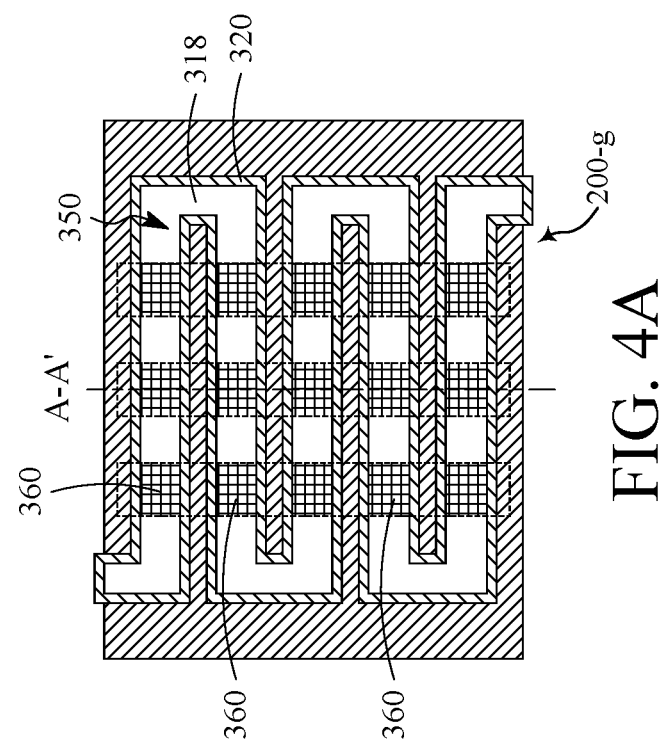
Figures 4C, 4D, 4E:
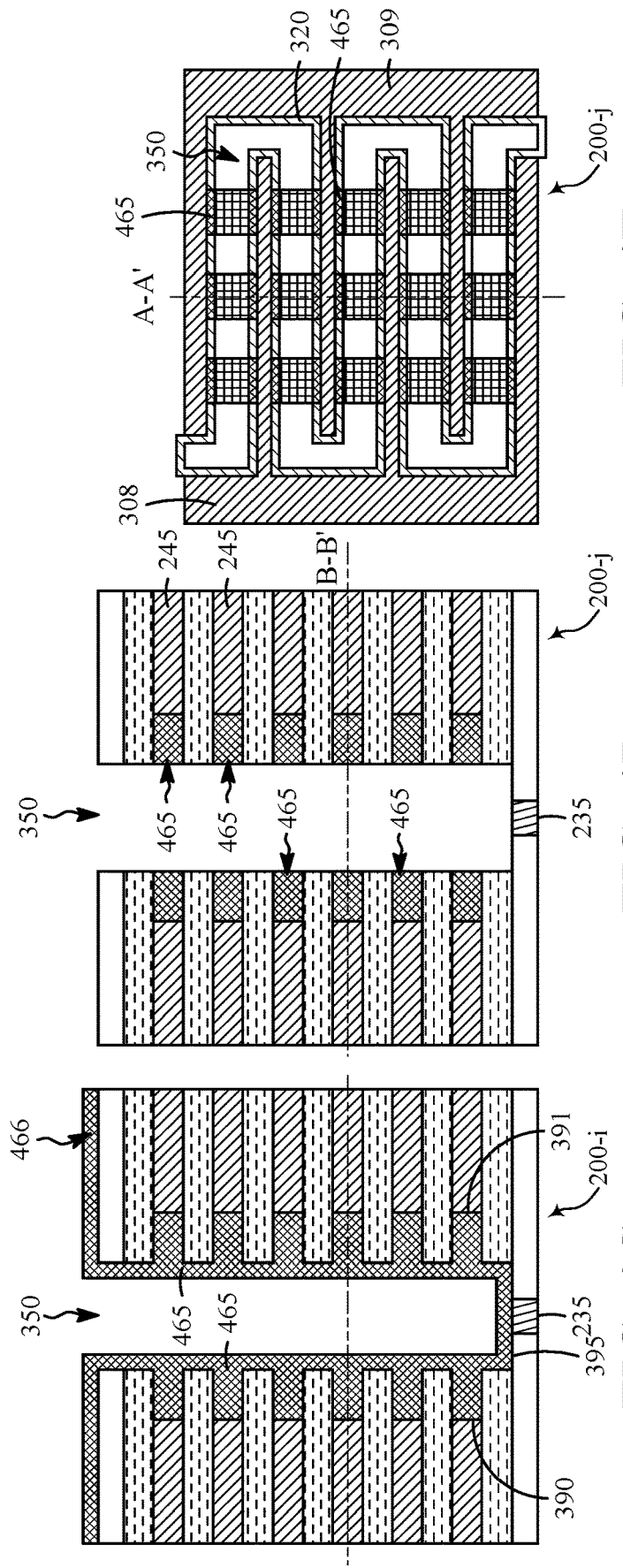

FIG. 4A illustrates a top view of a memory array 200-g, which may be an example of the memory array 200-f illustrated in FIG. 3E after formation of openings 360. FIG. 4B illustrates a cross-sectional view of an example 3D memory array 200-h along section line A-A' during a process step subsequent to what is illustrated in FIG. 4A. FIG. 4C illustrates a cross-sectional view of an example 3D memory array 200-i along section line A-A' during a process step subsequent to what is illustrated in FIG. 4B. FIG. 4D illustrates a cross-sectional view of an example 3D memory array 200-j along section line A-A' during a process step subsequent to what is illustrated in FIG. 4C. FIG. 4E illustrates a top view of the example 3D memory array 200-j of section line B-B' during a process step subsequent to what is illustrated in FIG. 4C.

FIG. 4A illustrates a top view through any one of the planes of the conductive material 245 of the memory array 200-g. A plurality of openings 360 in a trench 350 may be formed by etching away a portion of the dielectric material 318 and/or the conformal material 320. The openings 360 are intended to be positioned in alignment with the plurality of contacts 235 so that forming the openings 360 exposes at least a portion of a plurality of contacts 235 (shown in FIG. 4B) extending through the substrate 104 (shown in FIG. 4B). The etching process may be a vertical etching process. In some examples, the etching operation may not etch away all portions of the conformal material 320, for example, where the plurality of openings 360 are not formed.

FIG. 4B illustrates a cross-sectional view of an example 3D memory array 200-h in accordance with an example of the present disclosure. As shown in FIG. 4B, a plurality of recesses 315 may be formed in the conductive material 245 in each of the planes. For example, a selective etching operation may be performed to form the plurality of recesses 315 in a full or partially isotropic way. The etching chemistry may be selected to selectively reach a conductive material 245. The contacts 235 may be exposed by forming the openings 360 in in the trench 350.

FIG. 4C illustrates a cross-sectional view of an example 3D memory array 200-i in accordance with an example of the present disclosure. As shown in FIG. 4C, a storage element material 465 may be formed in the plurality of recesses 315 by conformally depositing the storage element material 465 into the trench 350. The storage element material 465 may be deposited to contact sidewalls 390 and 391 and a bottom wall 395 of the trench 350 exposed by the etching of the conformal material 320. When the storage element material 465 contacts the bottom wall 395 of the trench 350, the storage element material 465 covers the exposed contacts 235.

The storage element material 465 may be an example of a chalcogenide material, such as a chalcogenide alloy and/or glass, that may serve as a self-selecting storage element material (e.g., a material that may serve as both a select device and a storage element). For example, the storage element material 465 may be responsive to an applied voltage, such as a program pulse. For an applied voltage that is less than a threshold voltage, the storage element material 465 may remain in an electrically nonconductive state (e.g., an "off" state). Alternatively, responsive to an applied voltage that is greater than the threshold voltage, the storage element material 465 may enter an electrically conductive state (e.g., an "on" state).

The storage element material 465 may be programmed to a target state by applying a pulse (e.g., a programming pulse) that satisfies a programming threshold. The amplitude, shape, or other characteristics of the programming pulse may be configured to cause the storage element material 465 to exhibit the target state. For example, after applying the programming pulse, the ions of the storage element material 465 may be redistributed throughout the storage element, thereby altering a resistance of the memory cell detected when a read pulse is applied. In some cases, the threshold voltage of the storage element material 465 may vary based on applying the programming pulse.

The state stored by the storage element material 465 may be sensed, detected, or read by applying read pulse to the storage element material 465. The amplitude, shape, or other characteristics of the read pulse may be configured to allow a sense component to determine what state is stored on the storage element material 465. For example, in some cases, the amplitude of the read pulse is configured to be at a level that the storage element material 465 will be in an "on" state (e.g., current is conducted through the material) for a first state but will be in an "off" state (e.g., little to no current is conducted through the material) for a second state.

In some cases, the polarity of the pulse (whether programming or read) applied to the storage element material 465 may affect the outcomes of the operation being performed. For example, if the storage element material 465 stores a first state, a read pulse of a first polarity may result in the storage element material 465 exhibiting an "on" state while a read pulse of a second polarity may result in the storage element material 465 exhibiting an "off" state. This may occur because of the asymmetrical distributions of ions or other material in the storage element material 465 when it is storing a state. Similar principles apply to programming pulses and other pulses or voltages.

Examples of chalcogenide materials that may serve as the storage element material 465 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

FIG. 4D illustrates a cross-sectional view of an example 3D memory array 200-$j$ in accordance with an example of the present disclosure. An etching operation may be performed subsequent to forming the storage element material 465 so that surfaces of the storage element material 465 (e.g., the surfaces facing into the trench 350) is approximately coplanar with surfaces of the second insulative material 240 (e.g., the surfaces facing into the trench 350) as illustrated in FIG. 4D. The etching of the storage element material 465 may form a continuous sidewall and remove the top layer 466 (shown in FIG. 4C) of the storage element material 465, whereby cells of the storage element material 465 are formed in the recesses only. In each recess, each cell of the storage element material 465 may contact a single conductive material 245 (e.g., a single conductive material 245 located adjacent to the cell of the storage element material 465) and at least two dielectric layers (e.g. a top dielectric layer and a bottom dielectric layer located on top of the cell of the storage element material 465 and on bottom of the cell of the storage element material 465), as shown in FIG. 4D. The etching of the storage element material 465 may provide a configuration in which the storage element material 465 are separated from one another. The etching of the storage element material 465 may also expose the contacts 235 in the substrate 104. In some examples, portion of sacrificial material may be located on either side of the cell of the storage element material 465 (as shown in FIG. 4E).

FIG. 4E illustrates a top view of an example 3D memory array 200-$j$ in accordance with an example of the present disclosure. As illustrated in FIG. 4E, the conformal material 320 and the storage element material 465 formed in the trench 350 may bifurcate each plane of the conductive material 245 into a first portion 308 and a second portion 309. Each portion of a plane may be an example of a word line plate.

Figures 5A, 5B, 5C:
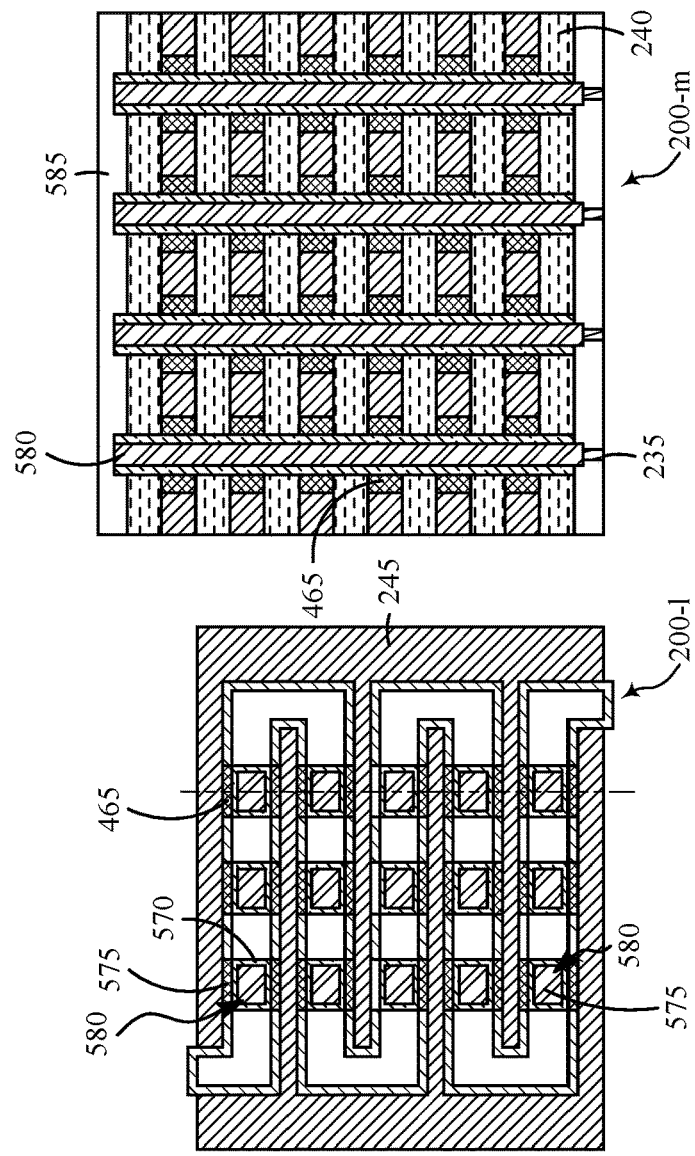
FIGS. 5A through 5C illustrate various views of example 3D memory arrays in accordance with examples as disclosed herein.

FIGS. 5A-C illustrates various views of example 3D memory arrays 200-$k$ and 200-$l$, during a series of steps or processes that may be performed to form a stacked memory device, in accordance with examples as disclosed herein. Specifically, FIGS. 5A-C illustrate processes of filling the openings 360 after the recessed self-selecting memory cells are formed.

FIG. 5A illustrates a top view of a memory array 200-$k$, which may be an example of the memory array 200-$j$ illustrated in FIG. 4E after formation of recessed self-selecting memory cells. FIG. 5B is a top view of a memory array 200-*l* through any one of the planes of the conductive material 245 illustrated in FIG. 4E during a processing step that is subsequent to what is illustrated in FIG. 5A. FIG. 5C illustrates a cross-sectional view of an example 3D memory array 200-*m* along section line A-A' during a processing step that is subsequent to what is illustrated in FIG. 5B.

FIG. 5A illustrates a top view of a memory array 200-*k* where a barrier material 570 is deposited into the openings 360 of the trench 350. In some implementations, the barrier material 570 contacts at least one portion of the first insulative material 240 (not shown), the second insulative material 240 (not shown), and the storage element material 465. In some examples, the barrier material 570 is compatible with an active material. In some examples, the barrier material 570 may be a conductive material, or a barrier layer with a conductive material. The barrier layer may comprise aluminum oxide, for example. In some examples, an etching operation may be performed to make room for conductive material to be deposited into the trench 350. In some cases, the barrier material 570 may be referred to as a barrier layer.

FIG. 5B illustrates a top view of a memory array 200-*l* where a conductive material 575 is deposited into the openings 360 of the trench 350. A conductive material 575 may deposited in the opening 360 to form a conductive pillar 580. The conductive pillar 580 may include the barrier material 570 and the conductive material 575. In some examples, the conductive pillar 580 may be formed in contact with the storage element material 465 on the sidewalls 390 and 391 (shown in FIG. 4C) of the trench 350. In some examples, the conductive pillar 580 may comprise the same material as the conductive material 575. In some examples, the conductive pillar 580 may be a digit line. The conductive pillar 580 may be a cylinder. Although FIG. 5D illustrates the conductive pillar 580 as a solid pillar, in some examples the conductive pillar 580 may be a hollow cylinder or toroidal (e.g., a tube). The conductive pillar 580 may comprise a metallic (or semi-metallic) material or a semiconductor material such as a doped polysilicon material, among others. However, other metallic, semi-metallic, or semiconductor materials may be used.

The conductive pillar 580 formed in each respective one of the plurality of openings 360 are arranged to extend substantially orthogonal to the alternating planes of the conductive material 245 and the second insulative material 240 (not shown). The storage element material 465 and the conductive pillar 580 formed in each respective one of the plurality of openings 360 are formed in a substantially square shape. However, examples of the present disclosure are not limited to exact or quasi-exact square shapes. For instance, the storage element material 465 and the conductive pillar 580 may formed in any shape, including circles or oval shapes, for instance.

FIG. 5C illustrates a side view of an example 3D memory array 200-*m* in accordance with an example of the present disclosure. As illustrated in FIG. 5C, a capping layer 585 (e.g., an insulative material, such as a dielectric layer) may be deposited to cap the conductive pillars 580 of memory array 200-*l*.

The memory array 200-*m* may include a plurality of vertical stacks. Each respective stack may include the conductive pillar 580, a conductive contact 235 coupled to the conductive pillar 580, the storage element material 465 formed in contact with the first portion 308 and the conductive pillar 580, and the storage element material 465 formed in contact with the second portion 309 and the conductive pillar 580.

The conductive pillar 580 may be in contact with the conductive contact 235 and the first insulative material 240, and in contact with the storage element material 465 formed in the recesses 315. In some cases, the storage element material 465 formed in each respective recess 315 is formed partially (e.g., not completely) around the conductive pillar 580.

Although not shown in FIG. 5C for clarity and so as not to obscure examples of the present disclosure, other materials may be formed before, after, and/or between the storage element material 465, and/or the conductive pillar 580, for example, to form adhesion layers or barriers against inter-diffusion of materials and/or to mitigate composition mixing.

Figure 6A:
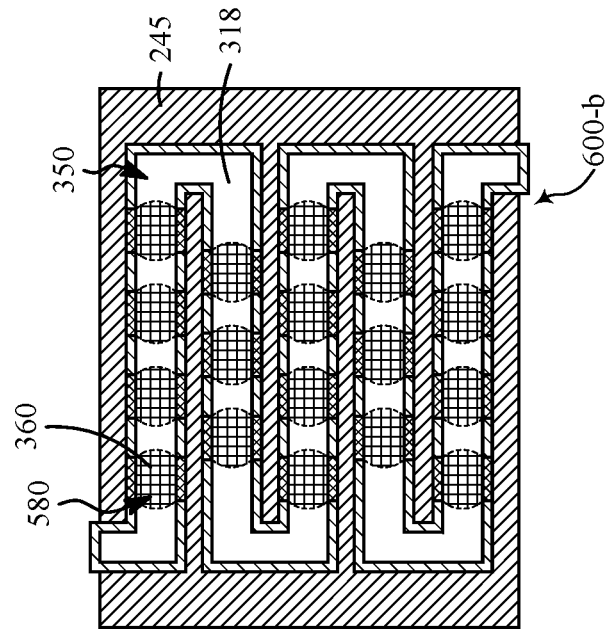
FIGS. 6A through 6B illustrate various views of example 3D memory arrays in accordance with examples as disclosed herein.
Figure 6B:
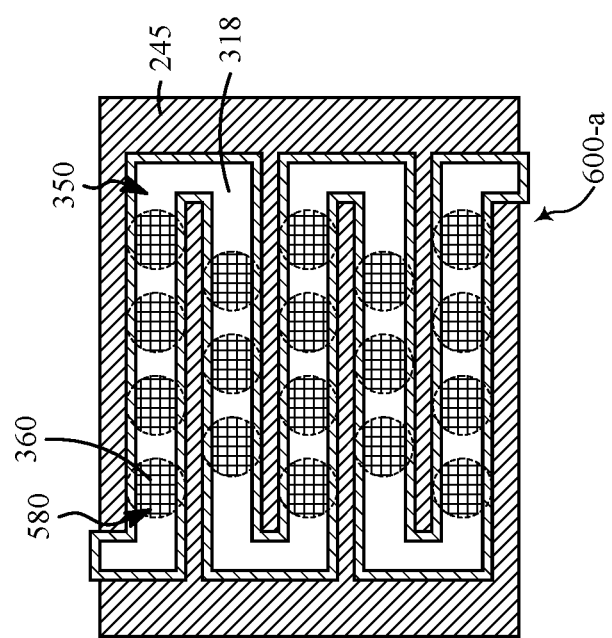

FIGS. 6A-B illustrates various views of example 3D memory arrays 600-*a* and 600-*b*, which may be examples of the 3D memory arrays 200-*a* through 200-*m* processed in FIGS. 2A-5C, in accordance with examples as disclosed herein. The memory arrays 600-*a* and 600-*b* may include similar features as memory array 200 described with reference to FIGS. 2A-5C. A plurality of openings 360 may be formed through the alternating planes of the conductive material 245 and the second insulative material 240 (not shown), and the dielectric material 318 in the trench 350. As shown, the diameter of the plurality of openings 360 is approximately the same width of the trench 350. In some examples, the diameter of the plurality of openings 360 may be greater than the width of the trench 350.

Each of the plurality of openings 360 may be approximately concentric with a different respective one of the conductive contacts 235. As shown in FIGS. 6A and 6B, the pillars 580 are circular and formed over and coupled to the plurality of contacts in geometric pattern in respective openings 360. In some examples, such as illustrated in FIGS. 2A-3E, the openings 360 may be square.

The plurality of openings 360 may have the staggered (e.g., hexagonal) arrangement of the conductive contacts 235 (not shown). For example, a respective one of the plurality of conductive contacts 235 may be surrounded by six other conductive contacts 235.

A staggered pattern may refer to any pattern where positions of objects (e.g., contacts, openings, or pillars) in a first row are offset from positions of objects (e.g., contacts, openings, or pillars) in a second row adjacent to the first row in a given direction. For example, a staggered pattern may have objects (e.g., contacts, openings, or pillars) adjacent to one another in the x-direction (e.g., rows), but not in the y-direction (e.g., columns). For instance, as illustrated in FIGS. 6A and 6B, the plurality of conductive contacts 235 are adjacent to each other and in line with each other in an x-direction. However, the plurality of conductive contacts 235 are not adjacent to each other in the y-direction. The plurality of conductive contacts 235 are in line with each other in the x-direction and the plurality of conductive contacts 235 alternate (e.g., skip) rows in the y-direction. Although, FIGS. 6A and 6B show spacing that is approximately the same between the conductive contacts 235 throughout the substrate 104, examples in accordance with the present disclosure are not so limited. For example, the spacing between the conductive contacts 235 may vary throughout the substrate 104.

FIG. 6B shows that the 3D memory array may include a plurality of storage element materials 465, each comprising a chalcogenide material positioned between at least one of the word line plates, at least one circular pillar 580, and at least one dielectric material 318. In some examples, depending on the decoding optimization, the pillars 580 may be coupled to a plurality of selectors positioned at a top, a bottom, or both a top and a bottom (e.g., below or above the plurality of word line plates) of the 3D memory array 600.

Figure 7B:
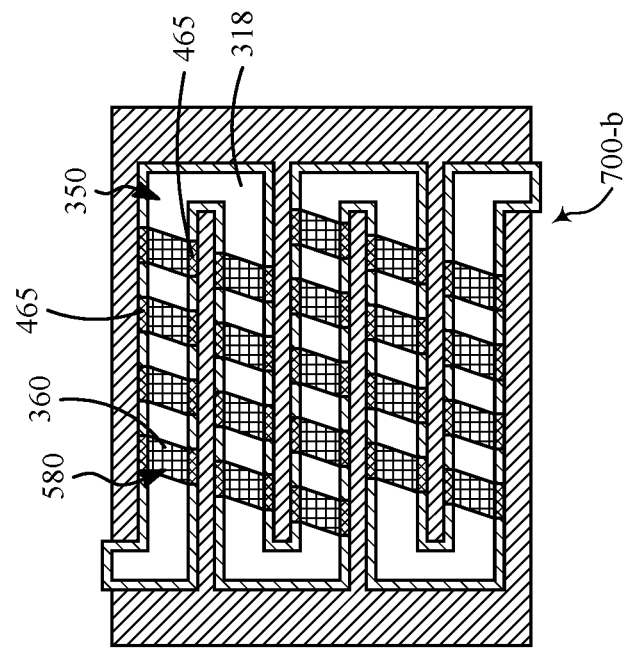
FIGS. 7A through 7B illustrate various views of example 3D memory arrays in accordance with examples as disclosed herein.
Figure 7A:
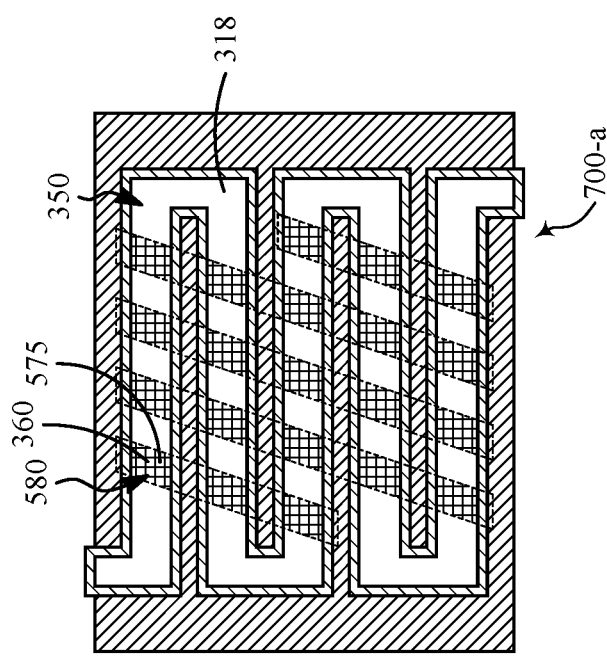

FIGS. 7A-B illustrates various views of example 3D memory arrays 700, which may be examples of the 3D memory arrays 200-*a* through 200-*m* processed in FIGS. 2A-5C, in accordance with examples as disclosed herein. A plurality of openings 360 may be formed through the alternating planes of the conductive material 245 and the second insulative material 240, and the dielectric material 318 in the trench 350. As shown, the diameter of the plurality of openings 360 is approximately the same width of the trench 350. In some examples, the diameter of the plurality of openings 360 may be greater than the width of the trench 350.

Each of the plurality of openings 360 may be approximately concentric with a different respective one of the conductive contacts 235. As shown in FIGS. 7A and 7B, the pillars 580 are rectangular oblique and formed over and coupled to the plurality of contacts in geometric pattern in respective openings 360.

The plurality of openings 360 may have the staggered (e.g., hexagonal) arrangement of the conductive contacts 235. For example, a respective one of the plurality of conductive contacts 235 may be surrounded by six other conductive contacts 235.

As used herein, "a staggered pattern" may refer to a plurality of conductive contacts that are adjacent to one another one direction but not in another direction. For example, a staggered pattern may have objects (e.g., contacts, openings, or pillars) adjacent to one another in the x-direction (e.g., rows), but not in the y-direction (e.g., columns).

For instance, as illustrated in FIGS. 7A and 7B, the plurality of conductive contacts 235 are adjacent to each other and in line with each other in an x-direction. However, the plurality of conductive contacts 235 are not adjacent to each other in the y-direction. The plurality of conductive contacts 235 are in line with each other in the x-direction and the plurality of conductive contacts 235 alternate (e.g., skip) rows in the y-direction. Although, FIGS. 7A and 7B show spacing that is approximately the same between the conductive contacts 235-*a* throughout the substrate 104, examples in accordance with the present disclosure are not so limited. For example, the spacing between the conductive contacts 235-*a* may vary throughout the substrate 104.

FIG. 7B shows that the 3D memory array may include a plurality of storage element materials 465, each comprising a chalcogenide material positioned between at least one of the word line plates, at least one rectangular oblique pillar 580, and at least one dielectric material 318.

In some examples, depending on the decoding optimization, the pillars 580 may be coupled to a plurality of selectors positioned at a top, a bottom, or both a top and a bottom (e.g., below or above the plurality of word line plates) of the 3D memory arrays 700. Spatially related terms, including but not limited to, "top," "bottom," "lower," "upper," "beneath," "below," "above," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Figure 8:
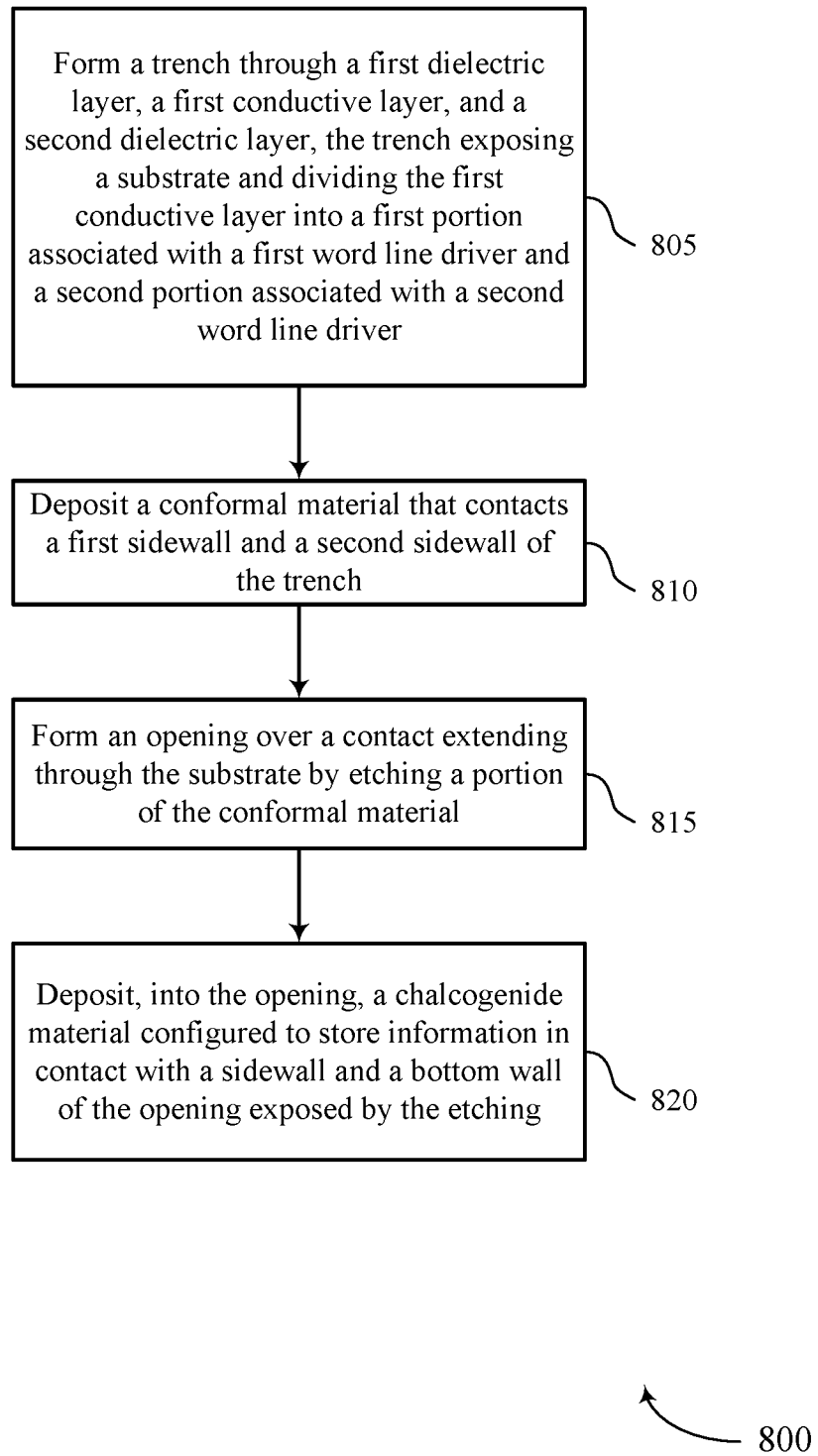
FIGS. 8 through 11 show flowcharts illustrating a method or methods that support architecture of three-dimensional memory device and methods regarding the same in accordance with examples as disclosed herein.

FIG. 8 shows a flowchart illustrating a method or methods 800 that supports architecture of three-dimensional memory device and methods regarding the same in accordance with aspects of the present disclosure. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 805, the method 800 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 805 may be performed according to the methods described herein.

At 810, the method 800 may include depositing a conformal material that contacts a first sidewall and a second sidewall of the trench. The operations of 810 may be performed according to the methods described herein.

At 815, the method 800 may include forming an opening over a contact extending through the substrate by etching a portion of the conformal material. The operations of 815 may be performed according to the methods described herein.

At 820, the method 800 may include depositing, into the opening, a chalcogenide material configured to store information in contact with a sidewall and a bottom wall of the opening exposed by the etching. The operations of 820 may be performed according to the methods described herein.

In some examples, an apparatus as described herein may perform a method or methods, such as the method 800. The apparatus may include features, means, or instructions (e.g., a non-transitory computer-readable medium storing instructions executable by a processor) for forming a trench through a first dielectric layer, a first conductive layer, and a second dielectric layer, the trench exposing a substrate and dividing the first conductive layer into a first portion associated with a first word line driver and a second portion associated with a second word line driver, depositing a conformal material that contacts a first sidewall and a second sidewall of the trench, forming an opening over a contact extending through the substrate by etching a portion of the conformal material, and depositing, into the opening, a chalcogenide material configured to store information in contact with a sidewall and a bottom wall of the opening exposed by the etching.

Some examples of the method 800 and the apparatus described herein may further include operations, features, means, or instructions for depositing a dielectric material in the trench that contacts the conformal material, where forming the opening includes etching a portion of the dielectric material. Some examples of the method 800 and the apparatus described herein may further include operations, features, means, or instructions for forming a set of contacts extending through the substrate, the set of contacts may be associated with a set of digit lines, forming the first dielectric layer on the substrate, forming the first conductive layer on the first dielectric layer, the first conductive layer configured as at least one word line plate, and forming the second dielectric layer on the first conductive layer, where forming the trench may be based on forming the second dielectric layer.

Some examples of the method 800 and the apparatus described herein may further include operations, features, means, or instructions for etching a portion of the chalcogenide material to form a continuous sidewall of the opening, and depositing a barrier material into the opening that contacts the continuous sidewall of the opening. In some examples of the method 800 and the apparatus described herein, the chalcogenide material includes a first wall contacting the first conductive layer, a second wall contacting the first dielectric layer, a third wall contacting the second dielectric layer, and a fourth wall contacting the barrier material. In some examples of the method 800 and the apparatus described herein, the barrier material contacts at least one portion of the first dielectric layer, the second dielectric layer, and the chalcogenide material.

Some examples of the method 800 and the apparatus described herein may further include operations, features, means, or instructions for etching the barrier material to expose the contact, and depositing a conductive material into the opening that contacts the barrier material and the contact. Some examples of the method 800 and the apparatus described herein may further include operations, features, means, or instructions for forming a second dielectric material over the second dielectric layer and the conductive material.

In some examples of the method 800 and the apparatus described herein, the conductive material may be configured as a digit line. In some examples of the method 800 and the apparatus described herein, forming the trench through the first dielectric layer may include operations, features, means, or instructions for performing a vertical etching process to vertically etch the trench, and performing a horizontal etching process after the vertical etching process to form at least one recess in the first conductive layer. In some examples of the method 800 and the apparatus described herein, the vertical etching process includes an anisotropic etching process or a dry etching process or a combination thereof. In some examples of the method 800 and the apparatus described herein, the horizontal etching process includes an isotropic etching process.

Some examples of the method 800 and the apparatus described herein may further include operations, features, means, or instructions for forming a set of openings over a set of contacts extending through the substrate, and filling the set of openings with a barrier material. Some examples of the method 800 and the apparatus described herein may further include operations, features, means, or instructions for forming the trench exposes at least a portion of a set of contacts extending through the substrate.

In some examples of the method 800 and the apparatus described herein, the trench extends through the first conductive layer in a serpentine shape. In some examples of the method 800 and the apparatus described herein, the trench including the first sidewall spaced apart from the second sidewall, where a first portion of the first sidewall formed by the first dielectric layer may be spaced apart from a first portion of the second sidewall formed by the first dielectric layer by a first distance, and a second portion of the first sidewall formed by the first conductive layer may be spaced apart from a second portion of the second sidewall formed by the first conductive layer by a second distance greater than the first distance.

Some examples of the method 800 and the apparatus described herein may further include operations, features, means, or instructions for portions of sidewalls of the trench formed by the first conductive layer may be recessed relative to portions of the sidewalls of the trench formed by the first dielectric layer. In some examples of the method 800 and the apparatus described herein, the chalcogenide material includes a storage element for a self-selecting memory cell.

Some examples of the method 800 and the apparatus described herein may further include operations, features, means, or instructions for forming a second conductive layer on the second dielectric layer, the second conductive layer configured as at least one word line plate, and forming a third dielectric layer on the second conductive layer, where forming the trench may be based on forming the third dielectric layer. In some examples of the method 800 and the apparatus described herein, an array of memory cells associated with the first conductive layer and the second conductive layer includes a three-dimensional array of memory cells.

Figure 9:
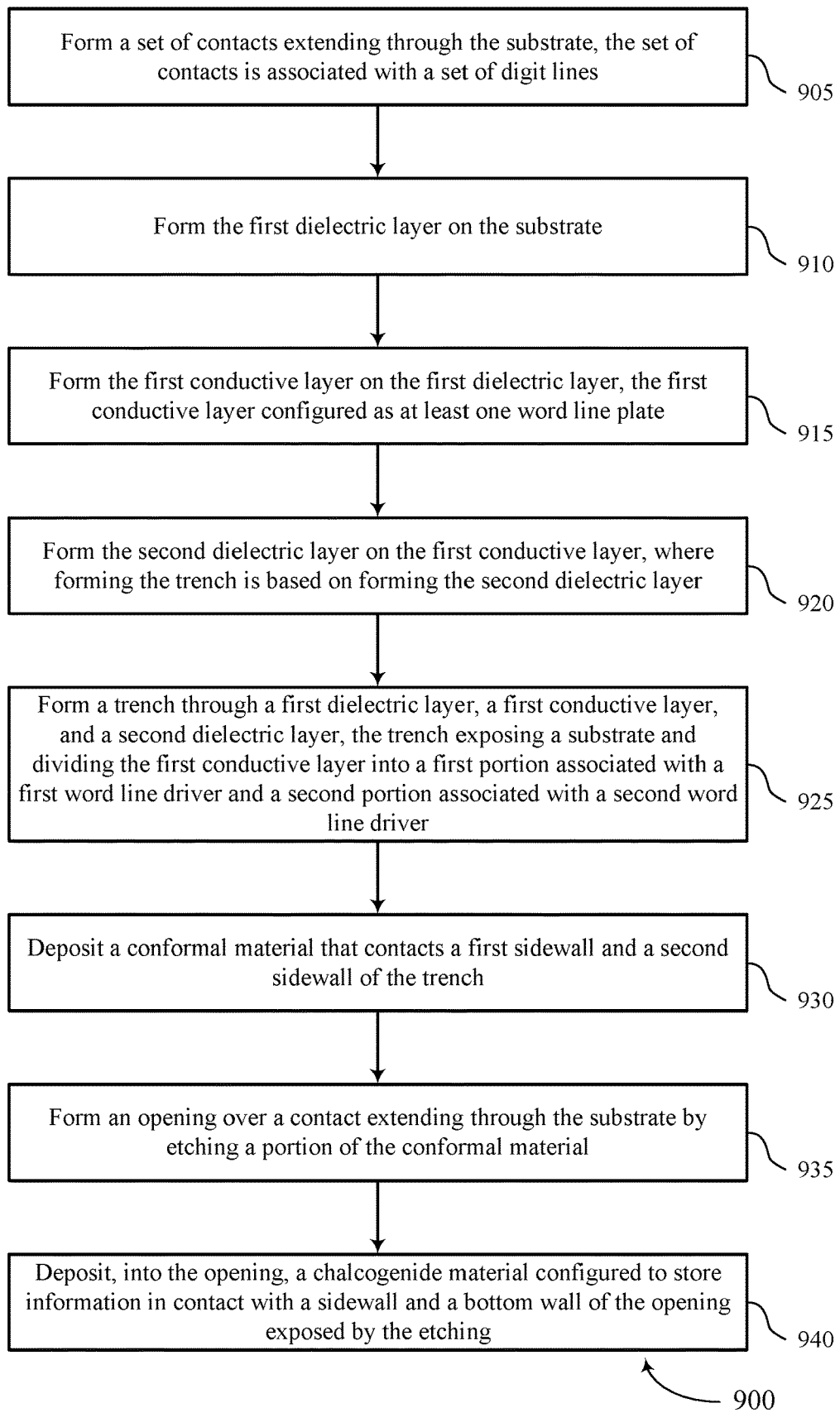

FIG. 9 shows a flowchart illustrating a method or methods 900 that supports architecture of three-dimensional memory device and methods regarding the same in accordance with aspects of the present disclosure. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 905, the method 900 may include forming a set of contacts extending through the substrate, the set of contacts is associated with a set of digit lines. The operations of 905 may be performed according to the methods described herein.

At 910, the method 900 may include forming the first dielectric layer on the substrate. The operations of 910 may be performed according to the methods described herein.

At 915, the method 900 may include forming the first conductive layer on the first dielectric layer, the first conductive layer configured as at least one word line plate. The operations of 915 may be performed according to the methods described herein.

At 920, the method 900 may include forming the second dielectric layer on the first conductive layer, where forming the trench is based on forming the second dielectric layer. The operations of 920 may be performed according to the methods described herein.

At 925, the method 900 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 925 may be performed according to the methods described herein.

At 930, the method 900 may include depositing a conformal material that contacts a first sidewall and a second sidewall of the trench. The operations of 930 may be performed according to the methods described herein.

At 935, the method 900 may include forming an opening over a contact extending through the substrate by etching a portion of the conformal material. The operations of 935 may be performed according to the methods described herein.

At 940, the method 900 may include depositing, into the opening, a chalcogenide material configured to store information in contact with a sidewall and a bottom wall of the opening exposed by the etching. The operations of 940 may be performed according to the methods described herein.

Figure 10:
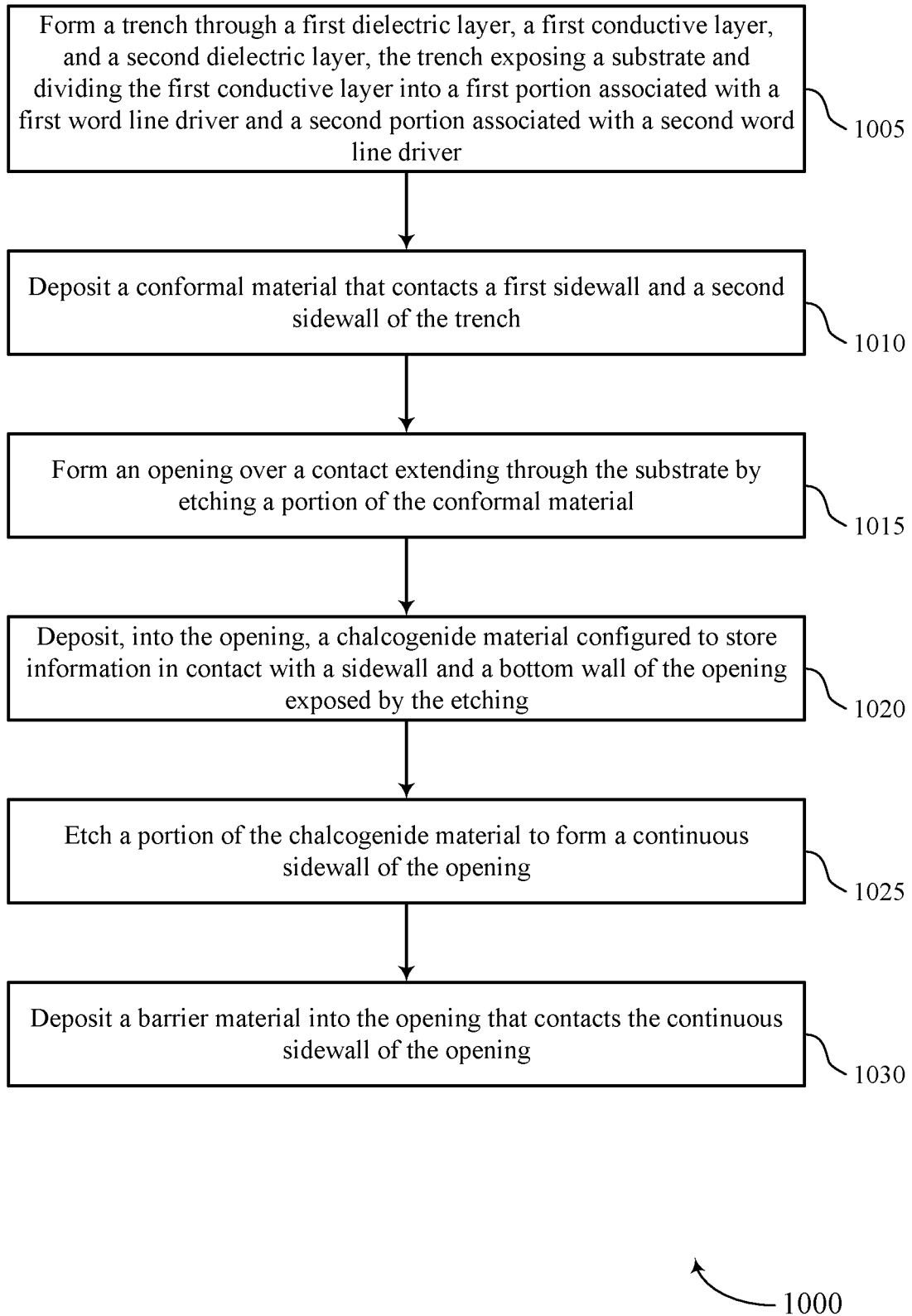

FIG. 10 shows a flowchart illustrating a method or methods 1000 that supports architecture of three-dimensional memory device and methods regarding the same in accordance with aspects of the present disclosure. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1005, the method 1000 may include forming a trench through a first dielectric layer, a first conductive layer, and a second dielectric layer, the trench exposing a substrate and dividing the first conductive layer into a first portion associated with a first word line driver and a second portion associated with a second word line driver. The operations of 1005 may be performed according to the methods described herein.

At 1010, the method 1000 may include depositing a conformal material that contacts a first sidewall and a second sidewall of the trench. The operations of 1010 may be performed according to the methods described herein.

At 1015, the method 1000 may include forming an opening over a contact extending through the substrate by etching a portion of the conformal material. The operations of 1015 may be performed according to the methods described herein.

At 1020, the method 1000 may include depositing, into the opening, a chalcogenide material configured to store information in contact with a sidewall and a bottom wall of the opening exposed by the etching. The operations of 1020 may be performed according to the methods described herein.

At 1025, the method 1000 may include etching a portion of the chalcogenide material to form a continuous sidewall of the opening. The operations of 1025 may be performed according to the methods described herein.

At 1030, the method 1000 may include depositing a barrier material into the opening that contacts the continuous sidewall of the opening. The operations of 1030 may be performed according to the methods described herein.

Figure 11:
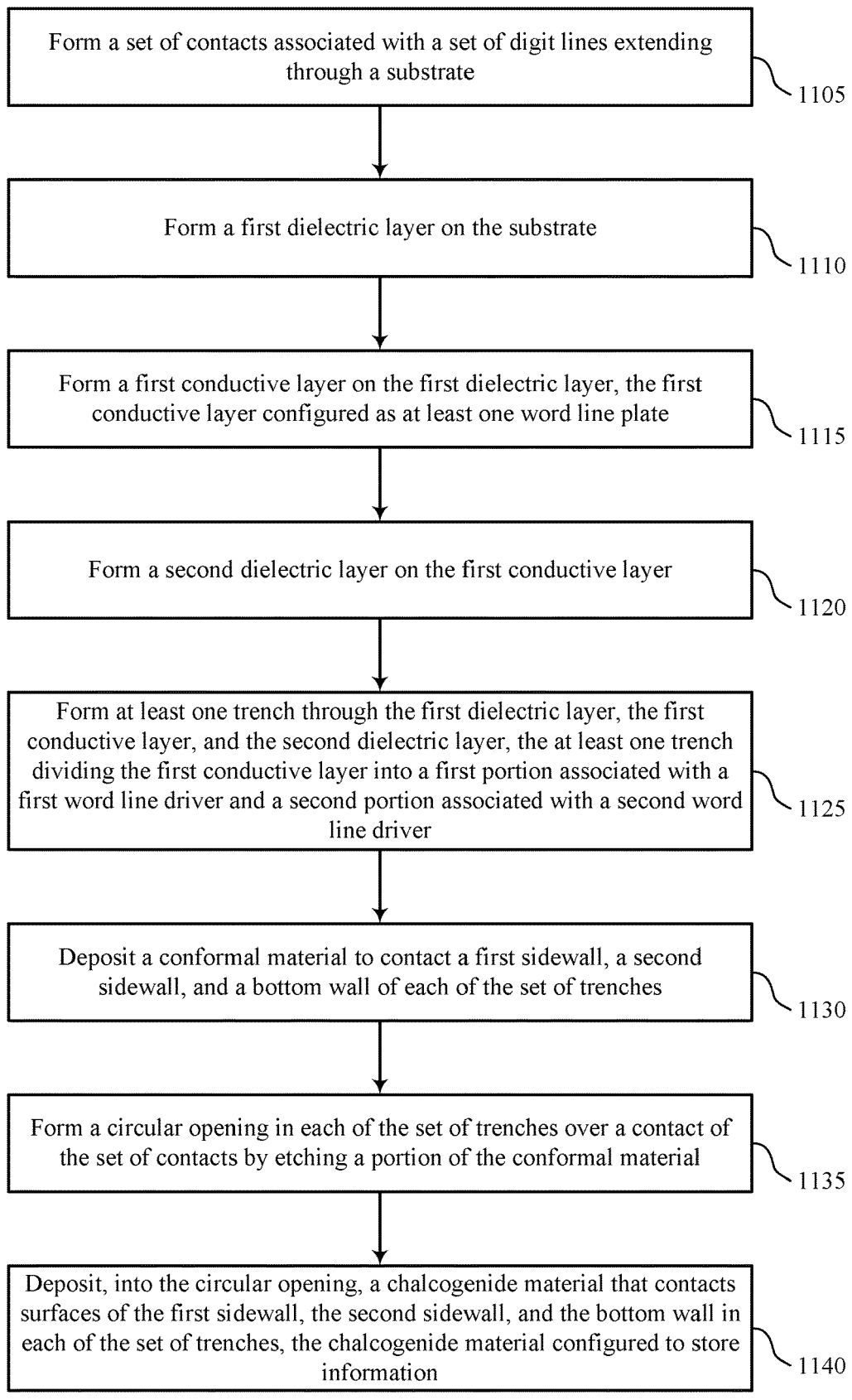

FIG. 11 shows a flowchart illustrating a method or methods 1100 that supports architecture of three-dimensional memory device and methods regarding the same in accordance with aspects of the present disclosure. The operations of method 1100 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1105, the method 1100 may include forming a set of contacts associated with a set of digit lines extending through a substrate. The operations of 1105 may be performed according to the methods described herein.

At 1110, the method 1100 may include forming a first dielectric layer on the substrate. The operations of 1110 may be performed according to the methods described herein.

At 1115, the method 1100 may include forming a first conductive layer on the first dielectric layer, the first conductive layer configured as at least one word line plate. The operations of 1115 may be performed according to the methods described herein.

At 1120, the method 1100 may include forming a second dielectric layer on the first conductive layer. The operations of 1120 may be performed according to the methods described herein.

At 1125, the method 1100 may include forming at least one trench through the first dielectric layer, the first conductive layer, and the second dielectric layer, the at least one trench dividing the first conductive layer into a first portion associated with a first word line driver and a second portion associated with a second word line driver. The operations of 1125 may be performed according to the methods described herein.

At 1130, the method 1100 may include depositing a conformal material to contact a first sidewall, a second sidewall, and a bottom wall of each of the set of trenches. The operations of 1130 may be performed according to the methods described herein.

At 1135, the method 1100 may include forming a circular opening in each of the set of trenches over a contact of the set of contacts by etching a portion of the conformal material. The operations of 1135 may be performed according to the methods described herein.

At 1140, the method 1100 may include depositing, into the circular opening, a chalcogenide material that contacts surfaces of the first sidewall, the second sidewall, and the bottom wall in each of the set of trenches, the chalcogenide material configured to store information. The operations of 1140 may be performed according to the methods described herein.

In some examples, an apparatus as described herein may perform a method or methods, such as the method 1100. The apparatus may include features, means, or instructions (e.g., a non-transitory computer-readable medium storing instructions executable by a processor) for forming a set of contacts associated with a set of digit lines extending through a substrate, forming a first dielectric layer on the substrate, forming a first conductive layer on the first dielectric layer, the first conductive layer configured as at least one word line plate, forming a second dielectric layer on the first conductive layer, forming at least one trench through the first dielectric layer, the first conductive layer, and the second dielectric layer, the at least one trench dividing the first conductive layer into a first portion associated with a first word line driver and a second portion associated with a second word line driver, depositing a conformal material to contact a first sidewall, a second sidewall, and a bottom wall of each of the set of trenches, forming a circular opening in each of the set of trenches over a contact of the set of contacts by etching a portion of the conformal material, and depositing, into the circular opening, a chalcogenide material that contacts surfaces of the first sidewall, the second sidewall, and the bottom wall in each of the set of trenches, the chalcogenide material configured to store information. Some examples of the method 1100 and the apparatus described herein may further include operations, features, means, or instructions for forming a set of pillars over the set of contacts in a hexagonal pattern, and coupling the set of pillars with a set of selectors positioned in at least at one of a top and a bottom of the apparatus.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of contacts associated with a set of digit lines and extending through a substrate, a second set of word line plates separated from a first set of word line plates, a dielectric material positioned between the first set and the second set of word line plates, the dielectric material extending in a serpentine shape over the substrate, a set of pillars formed over and coupled with the set of contacts, and a set of storage elements each including chalcogenide material positioned in a recess formed by at least one word line plate, at least one pillar, and at least one dielectric layer.

Some examples of the apparatus may include a conformal material extending between a first chalcogenide material and a second chalcogenide material in recesses between word line plates of first set of word line plates and contacting the dielectric material. In some examples, the conformal material may be positioned between word line plates of the first set of word line plates and the dielectric material. In some examples, a pillar of the set of pillars further includes a barrier layer contacting at least portions of the chalcogenide material and a conductive material contacting the barrier layer and configured as a digit line. In some examples, the barrier layer includes an aluminum oxide.

Some examples may further include at least one of the first set of word line plates and the second set of word line plates includes a conductive material. In some examples, the set of pillars formed over the set of contacts interrupts a continuity of the dielectric material extending over the substrate in the serpentine shape. In some examples, the set of contacts may be arranged in a staggered pattern. In some examples, the set of contacts may be arranged in a grid.

An apparatus is described. The apparatus may include a set of contacts associated with a set of digit lines extending through a substrate and arranged in a geometric pattern, a dielectric material separating a first set of a set of word lines plates from a second set of the set of word line plates, a set of circular pillars formed over the set of contacts and arranged in a geometric pattern, each circular pillar of the set of circular pillars coupled with a contact of the set of contacts, and a set of storage elements each including a chalcogenide material positioned between at least one of the word line plates, at least one circular pillar, and at least one dielectric layer. In some examples, the set of circular pillars may be coupled with a set of selectors positioned below the substrate or above the set of word line plates.

An apparatus is described. The apparatus may include a set of contacts associated with a set of digit lines extending through a substrate and arranged in a hexagonal pattern, a second word line plate positioned at a same level as a first word line plate and spaced apart from the first word line plate, a dielectric material extending in a serpentine shape over the substrate and positioned between the first word line plate and the second word line plate, a set of rectangular oblique pillars formed over the set of contacts and arranged in a hexagonal pattern, each rectangular oblique pillar coupled with a contact of the set of contacts, and a set of storage elements including a chalcogenide material positioned in a recess between at least one of the word line plates, at least one rectangular oblique pillar, and at least one dielectric layer. In some examples, the set of rectangular oblique pillars may be coupled with a set of selectors positioned below the substrate or above the first word line plate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that may, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples' other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above may be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a plurality of contacts associated with a plurality of digit lines and extending through a substrate;

a second plurality of word line plates separated from a first plurality of word line plates;

a dielectric material positioned between the first plurality and the second plurality of word line plates, the dielectric material extending in a serpentine shape over the substrate;

a plurality of pillars formed over and coupled with the plurality of contacts; and a plurality of storage elements each comprising chalcogenide material positioned in a recess formed by at least one word line plate, at least one pillar, and at least one dielectric layer.

2. The apparatus of claim 1, further comprising:

a conformal material extending between a first chalcogenide material and a second chalcogenide material in recesses between word line plates of the first plurality of word line plates and contacting the dielectric material.

3. The apparatus of claim 2, wherein the conformal material is positioned between word line plates of the first plurality of word line plates and the dielectric material.

4. The apparatus of claim 1, wherein a pillar of the plurality of pillars further comprises a barrier layer contacting at least portions of the chalcogenide material and a conductive material contacting the barrier layer and configured as a digit line.

5. The apparatus of claim 4, wherein the barrier layer comprises an aluminum oxide.

6. The apparatus of claim 1, wherein at least one of the first plurality of word line plates and the second plurality of word line plates comprises a conductive material.

7. The apparatus of claim 1, wherein the plurality of pillars formed over the plurality of contacts interrupts a continuity of the dielectric material extending over the substrate in the serpentine shape.

8. The apparatus of claim 1, wherein the plurality of contacts is arranged in a staggered pattern.

9. The apparatus of claim 1, wherein the plurality of contacts is arranged in a grid.

10. An apparatus, comprising:

a plurality of contacts associated with a plurality of digit lines extending through a substrate and arranged in a hexagonal pattern;

a second word line plate positioned at a same level as a first word line plate and spaced apart from the first word line plate;

a dielectric material extending in a serpentine shape over the substrate and positioned between the first word line plate and the second word line plate;

a plurality of rectangular oblique pillars formed over the plurality of contacts and arranged in a hexagonal pattern, each rectangular oblique pillar coupled with a contact of the plurality of contacts; and a plurality of storage elements comprising a chalcogenide material positioned in a recess between at least one of the word line plates, at least one rectangular oblique pillar, and at least one dielectric layer.

11. The apparatus of claim 10, wherein the plurality of rectangular oblique pillars is coupled with a plurality of selectors positioned below the substrate or above the first word line plate.

12. The apparatus of claim 10, wherein a rectangular oblique pillar of the plurality of rectangular oblique pillars further comprises a barrier layer contacting at least portions of the chalcogenide material and a conductive material contacting the barrier layer and configured as a digit line.

13. The apparatus of claim 10, wherein at least one of the first word line plate and the second word line plate comprises a conductive material.

14. The apparatus of claim 10, wherein the plurality of contacts is arranged in a staggered pattern or a grid pattern.

* * * * *